US008053900B2

(12) United States Patent
Yu et al.

(10) Patent No.: US 8,053,900 B2
(45) Date of Patent: Nov. 8, 2011

(54) THROUGH-SUBSTRATE VIAS (TSVS) ELECTRICALLY CONNECTED TO A BOND PAD DESIGN WITH REDUCED DISHING EFFECT

(75) Inventors: Chen-Hua Yu, Hsin-Chu (TW); Wen-Chih Chiou, Miaoli (TW); Weng-Jin Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 211 days.

(21) Appl. No.: 12/255,060

(22) Filed: Oct. 21, 2008

(65) Prior Publication Data

US 2010/0096760 A1 Apr. 22, 2010

(51) Int. Cl.
*H01L 23/48* (2006.01)

(52) U.S. Cl. ............... 257/774; 257/777; 257/E23.011; 438/667

(58) Field of Classification Search .................. None
See application file for complete search history.

(56) References Cited

U.S. PATENT DOCUMENTS

| | | | |
|---|---|---|---|
| 5,786,238 A | 7/1998 | Pai et al. | |
| 6,100,475 A | 8/2000 | Degani et al. | |
| 6,531,384 B1 * | 3/2003 | Kobayashi et al. | 438/612 |
| 6,838,774 B2 * | 1/2005 | Patti | 257/773 |
| 7,042,100 B2 * | 5/2006 | Yamamoto et al. | 257/775 |
| 7,265,441 B2 | 9/2007 | Reiss et al. | |
| 7,323,785 B2 | 1/2008 | Uchiyama | |
| 2002/0003307 A1 * | 1/2002 | Suga | 257/777 |
| 2002/0047218 A1 * | 4/2002 | Liu et al. | 257/786 |
| 2002/0117756 A1 | 8/2002 | Yamashita | |
| 2003/0062625 A1 * | 4/2003 | Anand | 257/758 |
| 2004/0188696 A1 * | 9/2004 | Chen et al. | 257/99 |
| 2005/0001326 A1 | 1/2005 | Masuda | |
| 2005/0127529 A1 | 6/2005 | Huang et al. | |
| 2006/0043535 A1 | 3/2006 | Hiatt | |
| 2006/0076664 A1 | 4/2006 | Chen et al. | |
| 2006/0202347 A1 | 9/2006 | Egawa | |
| 2007/0057358 A1 | 3/2007 | Satou et al. | |
| 2007/0126005 A1 | 6/2007 | Baek et al. | |
| 2007/0166997 A1 * | 7/2007 | Knorr | 438/622 |
| 2007/0170584 A1 * | 7/2007 | Chatterjee | 257/734 |
| 2008/0006938 A1 * | 1/2008 | Patti et al. | 257/734 |
| 2008/0258309 A1 | 10/2008 | Chiou et al. | |
| 2009/0160050 A1 * | 6/2009 | Miyakawa et al. | 257/737 |

OTHER PUBLICATIONS

Liu, C.C., et al., "Mapping System-on-Chip Designs from 2-D to 3-D ICs," Circuit and Systems, IEEE 2005, vol. 3, May 23-26, 2005, pp. 2939-2942.

* cited by examiner

*Primary Examiner* — Marcos D Pizarro Crespo
*Assistant Examiner* — Andres Munoz
(74) *Attorney, Agent, or Firm* — Slater & Matsil, L.L.P.

(57) ABSTRACT

An integrated circuit structure includes a semiconductor chip, which further includes a first surface; and a patterned bond pad exposed through the first surface. The patterned bond pad includes a plurality of portions electrically connected to each other, and at least one opening therein. The integrated circuit further includes a dielectric material filled into at least a portion of the at least one opening.

12 Claims, 8 Drawing Sheets

THROUGH-SUBSTRATE VIAS (TSVS) ELECTRICALLY CONNECTED TO A BOND PAD DESIGN WITH REDUCED DISHING EFFECT

CROSS REFERENCES TO RELATED APPLICATION

This application relates to the following commonly-assigned U.S. patent application: application Ser. No. 11/788,974, filed Apr. 23, 2007, and entitled "Three-Dimensional

TECHNICAL FIELD

This invention relates generally to integrated circuits, and more particularly to bond pad design.

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surfaces of the semiconductor substrates in the semiconductor wafers. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

An additional limit comes from the significant increase in the number and the length of interconnections between devices as the number of devices increases. When the number and the length of interconnections increase, both circuit RC delay and power consumption increase.

Three-dimensional (3D) integrated circuits (ICs) are therefore created to resolve the above-discussed limitations. In a typical 3D integrated circuit formation process, two wafers, each including an integrated circuit, are formed. The wafers are then bonded with the devices aligned. Through-silicon vias may then be used to interconnect devices on the two wafers.

Conventional methods for bonding two wafers include adhesive bonding, direct copper bonding and direct oxide bonding. In the commonly used direct copper bonding, each of the two wafers has copper pads exposed on the surfaces of the wafers, and the two wafers are bonded by applying a high pressure, so that the copper pads are bonded together.

Figure 1:
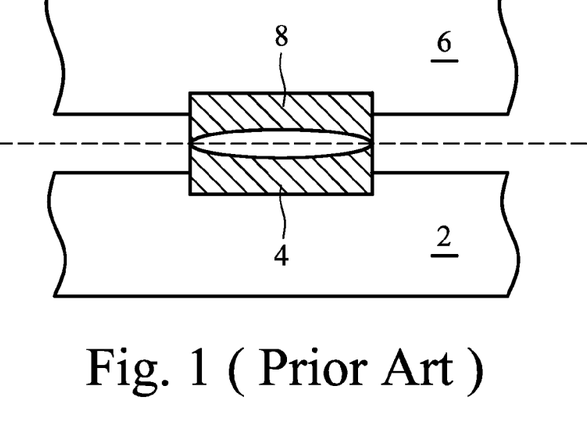
FIG. 1 illustrates a conventional bonding including large bond pads, wherein the large bond pads suffer from dishing effects.

Due to the customized circuit requirements, some bond pads need to be large. These large bond pads suffer from problems. FIG. 1 illustrates the bonding of two chips through large bond pads. Chip 2 includes large bond pad 4, chip 6 includes large bond pad 8. Bond pads 4 and 8 are bonded through direct copper bonding. In the formation of bond pads 4 and 8, chemical mechanical polish (CMP) processes typically involved. However, since bond pads 4 and 8 are large, the respective regions of bond pads 4 and 8 are pattern-dense regions. As a result, during the CMP processes for forming large bond pads 4 and 8, a dishing effect occurs, which causes the center regions of bond pads 4 and 8 to be polished more than the edge regions.

It is observed from FIG. 1 that the dishing effect may cause various problems. First, the reliability of the bonding is adversely affected. With the dishing effect, only small portions of bond pads 4 and 8 are bonded to each other, and hence the bonding is less reliable. Second, the current that may flow through the bonded area is reduced due to the reduced bond area. These problems defeat the purpose of designing large bond pads, and hence need to be addressed.

SUMMARY OF THE INVENTION

In accordance with one aspect of the present invention, an integrated circuit structure includes a semiconductor chip, which further includes a first surface; and a patterned bond pad exposed through the first surface. The patterned bond pad includes a plurality of portions electrically connected to each other, and at least one opening therein. The integrated circuit further includes a dielectric material filled into at least a portion of the at least one opening.

In accordance with another aspect of the present invention, an integrated circuit structure includes a semiconductor chip, which further includes a first surface; a first patterned bond pad exposed through the first surface, wherein the first patterned bond pad includes a plurality of portions, and a plurality of openings between the plurality of portions; connection structures connecting the plurality of portions of the first patterned bond pad; a semiconductor substrate underlying the first patterned bond pad; a through-silicon via (TSV) in the semiconductor substrate and electrically connected to the first patterned bond pad; and a solid bond pad exposed through the first surface. The solid bond pad is smaller than the first patterned bond pad.

In accordance with yet another aspect of the present invention, an integrated circuit structure includes a first and a second semiconductor chip. The first semiconductor chip includes a first surface; and a first patterned bond pad exposed through the first surface. The first patterned bond pad includes a plurality of portions, and a plurality of openings between the plurality of portions. The second semiconductor chip includes a second surface; and a second bond pad exposed through the second surface and bonded to the first patterned bond pad through direct bonding.

The advantageous features of the present invention include reduced dishing effects in the formation of large bond pads, and hence improved bonding quality.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Generally, an embodiment of the present invention provides an improved bond pad structure for semiconductor chips. An embodiment of the present invention is preferably designed so that the bond pad has slots/openings therein in order to reduce the local pattern density. This is advantageous for minimizing dishing effects. Several embodiments of the present invention will be described herein, which may be used in the context of direct metal-to-metal bonding (often known as direct copper bonding), for example. However, any embodiment of the present invention may also be applied in other contexts.

Figure 2:
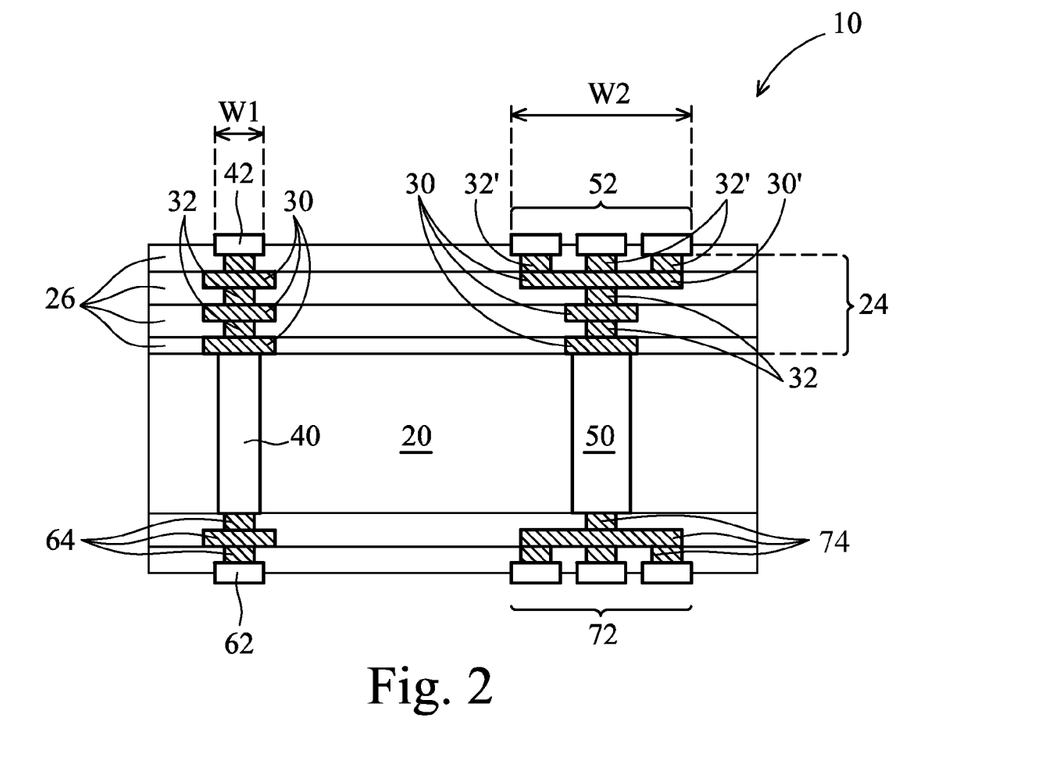
FIG. 2 illustrates a cross-sectional view of an embodiment of the present invention, wherein a large bond pad includes openings therein.

FIG. 2 illustrates semiconductor chip 10, which is a portion of a wafer. Semiconductor chip 10 includes semiconductor substrate 20, which may be formed of commonly known semiconductor materials such as silicon, silicon germanium, or the like. Integrated circuits (not shown) are formed at the surface of semiconductor substrate 20, wherein the integrated circuits may include complementary metal-oxide-semiconductor (CMOS) transistors and other devices such as capacitors, resistors, and the like. Over the integrated circuits resides interconnect structure 24, which includes a plurality of dielectric layers 26, including, but not limited to, inter-metal dielectrics (IMD), passivation layers, and the like. Interconnect structure 24 interconnects the underlying integrated circuits, and connects the integrated circuits and through-silicon vias (TSV) 40 and 50 to respective bond pads 42 and 52, which are formed on the front surface of semiconductor chip 10. Throughout the description, the side (in this case, the top side) of semiconductor chip 10 close to the interconnect structure 24 is referred to as the front side, while the opposite side of semiconductor chip 10 is referred to as a backside.

As is known in the art, the IMDs 26 may be formed of low-k dielectric materials with k values less than, for example, about 2.5. Metal lines 30 and vias 32 are formed in the plurality of dielectric layers 26, and may be formed of copper using the well-known damascene process, or formed of other metals such as aluminum, tungsten, silver, or the like.

In an embodiment of the present invention, semiconductor chip 10 includes TSVs 40 and 50, which extend through substrate 20, and interconnects the features on the front side to the backside of substrate 20. TSV 40 is electrically connected to bond pad 42, and TSV 50 is electrically connected to bond pad 52, wherein both TSVs 40 and 50 are formed on the front side of semiconductor chip 10. Bond pads 42 and 52 are formed simultaneously, and hence are formed of a same material. In an embodiment of the present invention, bond pad 42 is smaller (in a top view) than bond pad 52. TSV 50 may have a greater, or a same, cross-sectional area (in a top view) than TSV 40. Accordingly, bond pad 42 and TSV 40 may be used to carry a relatively small current, for example, a signal current, while bond pad 52 and TSV 50 may be used to carry a relatively great current, for example, a power supply current. Bond pad 42 may be electrically disconnected from bond pad 52.

Figure 3A:
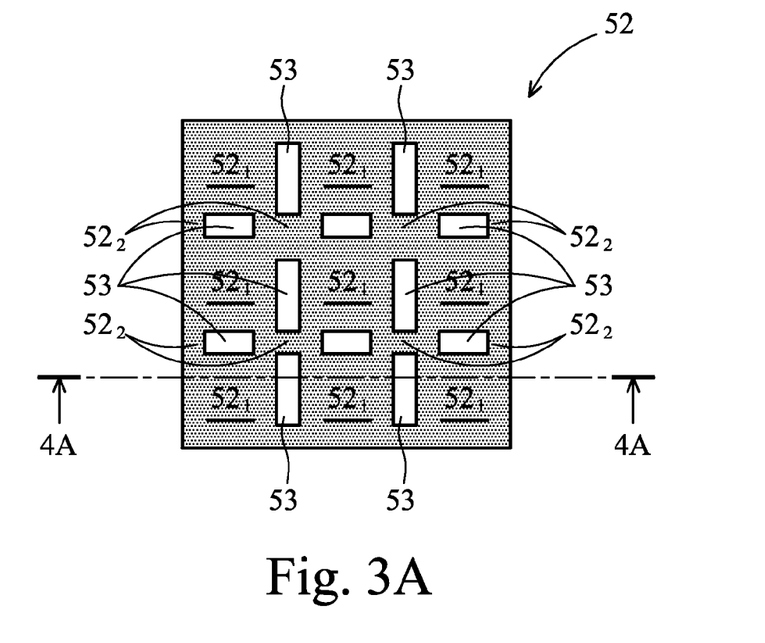
FIGS. 3A through 3D are top views of the bond pad shown in FIG. 2.
Figure 3B:
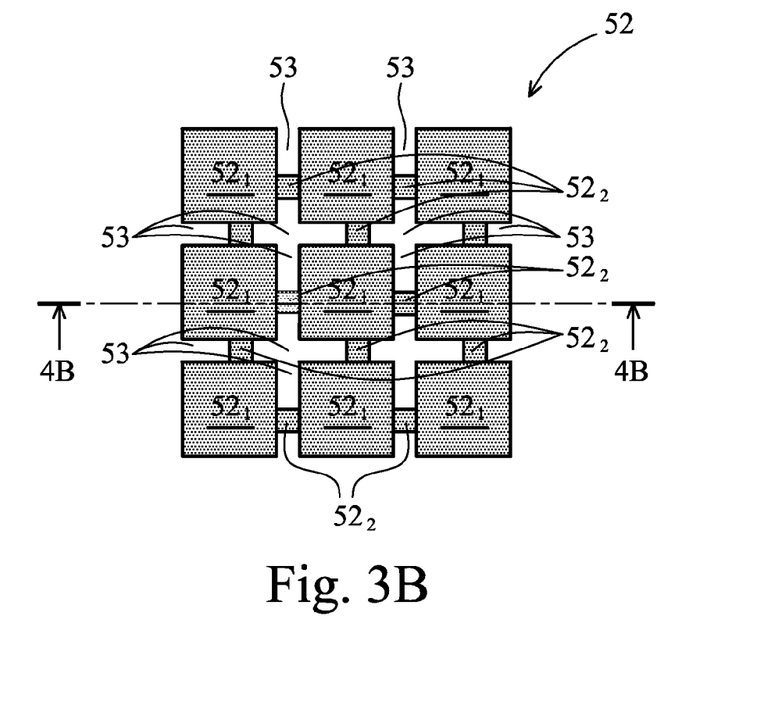

In an embodiment of the present invention, bond pad 42 is a solid pad, with no slots or openings therein. On the other hand, bond pad 52 is patterned with openings therein. FIGS. 3A through 3D are top views of several possible designs of bond pad 52. Throughout the description, the bond pads 52 as shown in FIGS. 3A through 3D are referred to as patterned bond pads. Both FIGS. 3A and 3B show bond pads 52 including portions $52_1$ separated by openings 53, and interconnection portions $52_2$ for connecting portions $52_1$. Interconnection portions $52_2$ are also in the same layer as portions $52_1$. In an embodiment, as shown in FIG. 2, portions $52_1$ of bond pad 52 comprise lower portions in the top dielectric layer of IMDs 26, and upper portions protruding beyond the top surface of the top dielectric layer of IMDs 26.

Figure 3C:
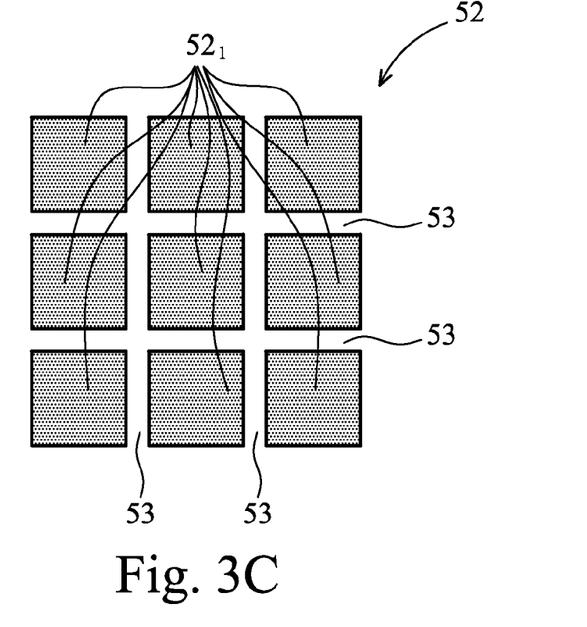

On the other hand, FIG. 3C illustrates another embodiment in which bond pad 52 includes a plurality of discrete portions $52_1$ separated by openings 53. In the layer in which bond pad 52 is located, there is no electrical connection between discrete portions $52_1$. Electrical connections are provided through the underlying vias and metal lines. In an exemplary embodiment, as shown in FIG. 2, the electrical connections between the discrete portions $52_1$ are made through metal line 30' and vias 32'. Metal line 30' and vias 32' may be in the metallization layer (or inside the passivation layer) immediately underlying bond pad 52, which may be a top metallization layer (commonly referred to Mtop) or a redistribution layer. In other embodiments, the electrical interconnection between discrete portions $52_1$ may be provided in any of the underlying metallization layers ranging from the bottom metallization layer (commonly referred to as M1) to the top metallization layer Mtop. With the structure shown in FIGS. 3A through 3C, bond pad 52 acts as an integrated bond pad, meaning that the connection to any of the bond pad portions $52_1$ is equivalent to the connection to other portions.

Figure 3D:
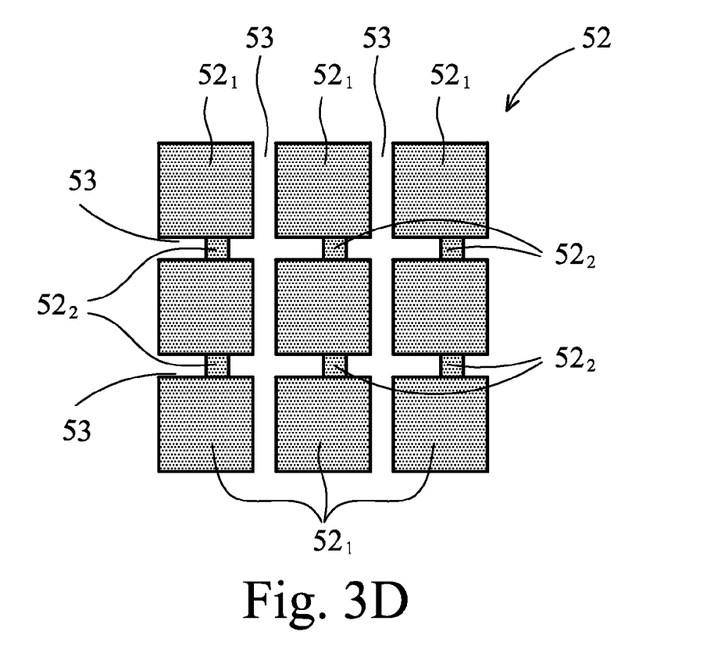

Combination schemes may be formed to include both the embodiments shown in FIGS. 3A and 3B, and the embodiment shown in 3C. In the combination schemes, some of the portions $52_1$ are interconnected through interconnection portions $52_2$ as groups, while different groups of the interconnected portions $52_1$ are disconnected from each other. An exemplary embodiment is shown in FIG. 3D, in which each column of portions $52_1$ are interconnected, while the columns are discrete. Again, there will be at least one underlying via 32' connected to each of the columns, and the vias 32' are interconnected (refer to FIG. 2).

Openings 53, as shown in FIGS. 3A through 3D, are at least partially filled with a dielectric material. Referring to FIG. 2, at least lower portions of openings 53 are filled with the material of the top one of the plurality of dielectric layers 26.

In the case the embodiments as shown in FIG. 3A or FIG. 3B are adopted, there may be more than one via 32' connected to the bond pad portions $52_1$, as shown in FIG. 2. Alternatively, since portions $52_1$ are already interconnected, there may be only one via 32' (refer to FIG. 2) formed and connected to only one of the bond pad portions $52_1$ (refer to FIGS. 3A and 3B). However, in the case the embodiments as shown in FIGS. 3C and 3D are adopted, each of the discrete portions $52_1$ has to have an underlying via 32' connected to it. Otherwise, the ones without the connecting vias 32' will not be able to connect with other portions.

Figure 4A:
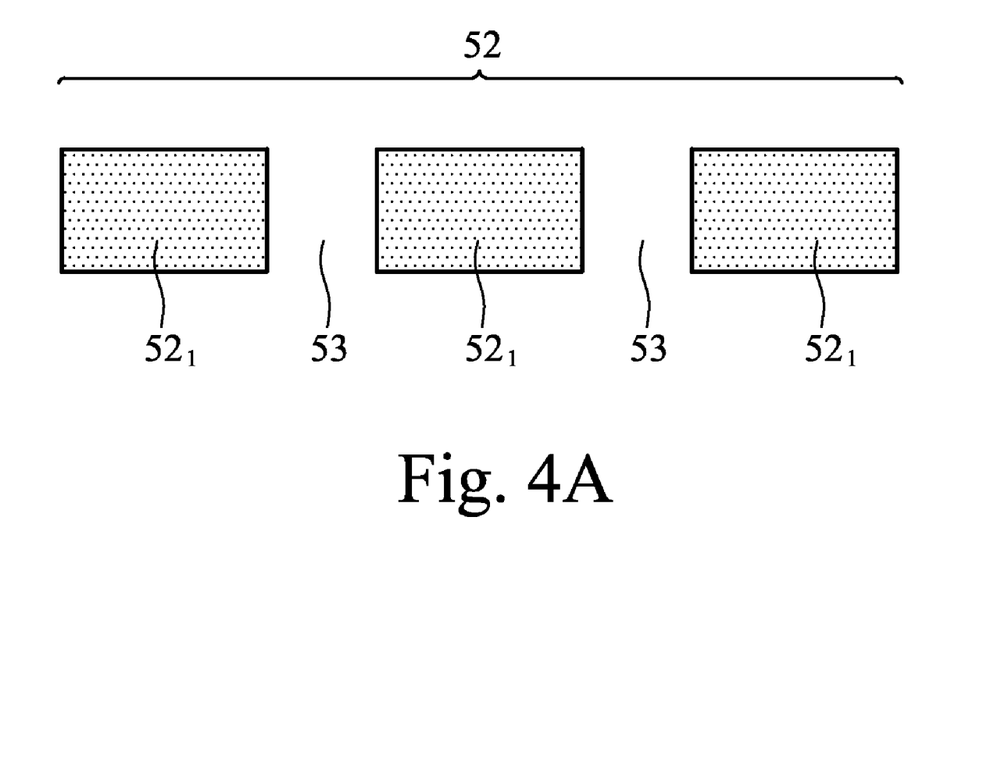
FIG. 4A illustrates a cross-sectional view of a bond pad, wherein the cross-sectional view is made in a plane crossing line 4A-4A in FIG. 3A.
Figure 4B:
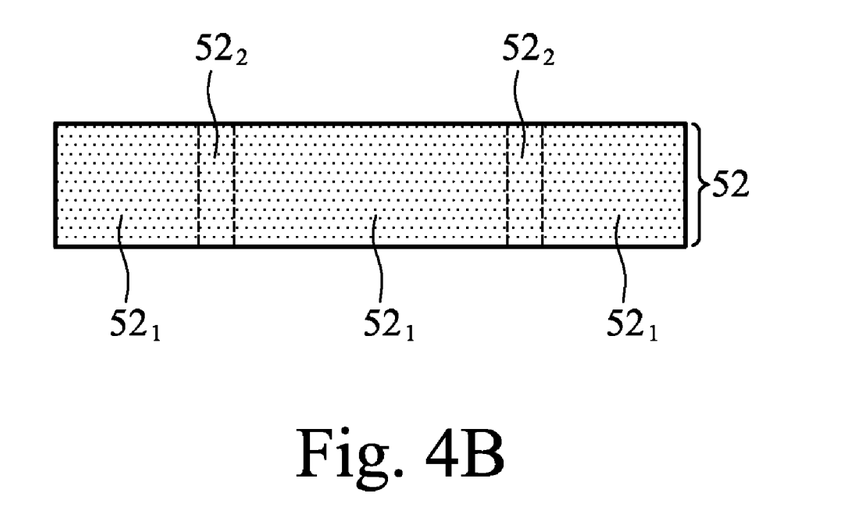
FIG. 4B illustrates a cross-sectional view of a bond pad, wherein the cross-sectional view is made in a plane crossing line 4B-4B in FIG. 3B.

Please note that depending on where the cross-sectional view as shown in FIG. 2 is obtained, the cross-sectional view of bond pad 52 may appear as solid bonds as shown in FIG. 4A, or appear as one continuous pad as indicated by FIG. 4B, wherein FIG. 4A may be the cross-sectional view taken along a plane crossing line 4A-4A in FIG. 3A, while FIG. 4B may be the cross-sectional view taken along a plane crossing line 4B-4B in FIG. 3B.

Preferably, throughout the entire semiconductor chip 10 (and possibly the entire wafer), a threshold lateral dimension is predetermined, and any bond pad with a lateral dimension (either width and/or length) greater than the threshold lateral dimension will have a patterned design as shown in FIGS. 3A through 3D, for example, while any bond pad having lateral dimensions (width and/or length) less than the threshold lateral dimension will be solid.

Referring again back to FIG. 2, on the backside of semiconductor chip 10, bond pads 62 and 72 may be formed. In an embodiment, bond pads 62 and 72 have the specification similar to that of bond pads 42 and 52, respectively. Accordingly, bond pad 72 may be larger than bond pad 62. In addition, bond pad 72 may have a structure essentially the same as shown in FIGS. 3A through 4B. Redistribution lines 64 and 74 may be formed on the backside of substrate 20 to connect bond pad 62 to TSV 40, and to connect bond pad 72 to TSV 50. The formation details of redistribution lines are known in the art, and hence are not repeated herein. In alternative embodiments, instead of forming bond pads 62 and 72, TSVs 40 and 50 may be exposed to the back of substrate 20 in the form of copper posts, which are also used for bonding purposes.

Figure 5:
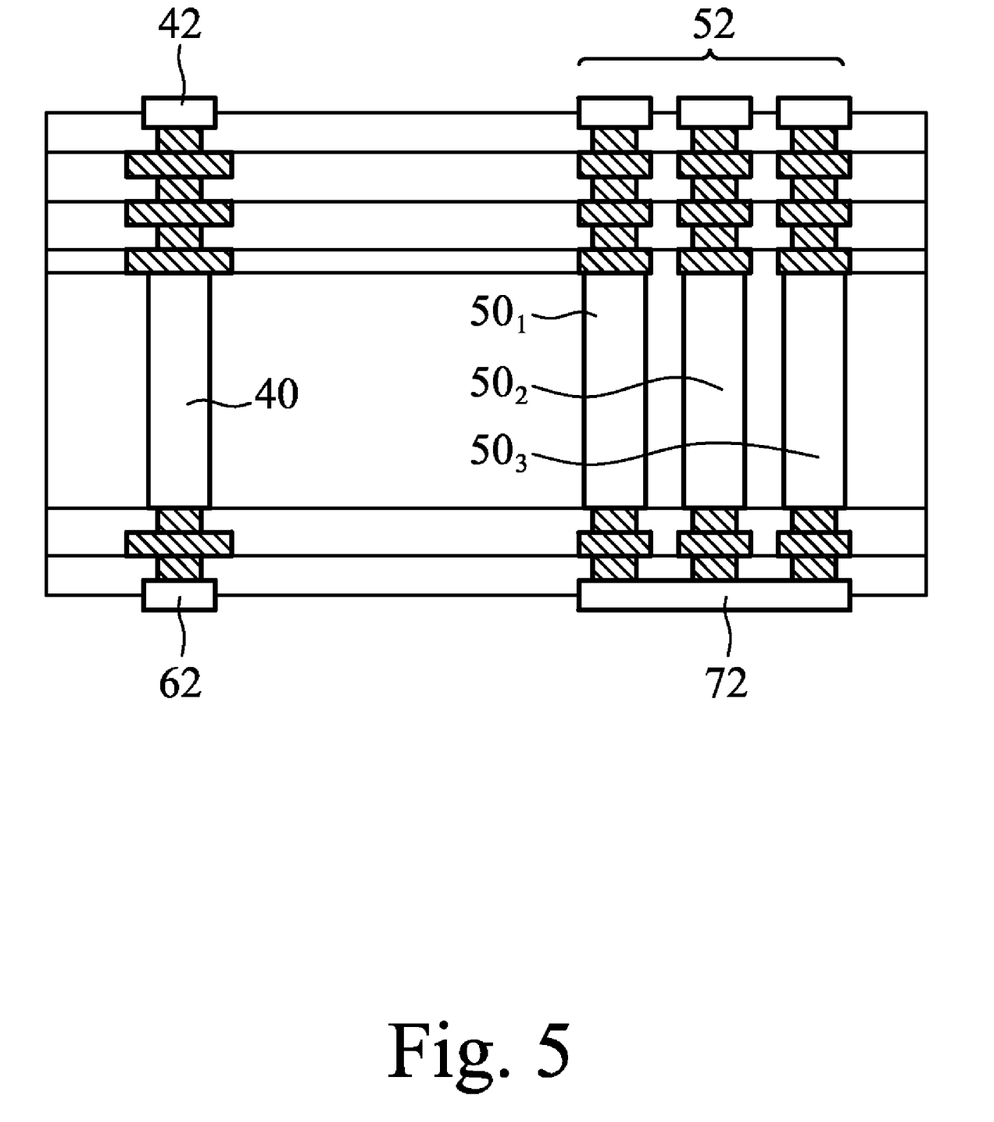
FIG. 5 illustrates an embodiment with a plurality of through-silicon vias connected to a same large bond pad.

FIG. 5 illustrates an alternative embodiment, wherein instead of using one TSV to interconnect features on opposite sides of substrate 20, more than one TSV may be used to electrically connect to a same bond pad. It is noted that although in FIG. 5, bond pad 52 is shown as having discrete portions; it may have the structures as shown in FIGS. 3A, 3B, 3C, or 3D. On the other hand, although bond pad 72 is shown as being a continued piece in FIG. 5, it may also have the structures as shown in FIGS. 3A, 3B, 3C, or 3D. Accordingly, TSVs $50_1$, $50_2$, and $50_3$ may be electrically interconnected through any of the bond pads 52 or 72. Alternatively, metal lines and/or redistribution lines similar to metal lines 30 and redistribution lines 74 (refer to FIG. 2) may be used to interconnect TSVs $50_1$, $50_2$, and $50_3$.

Figure 6:
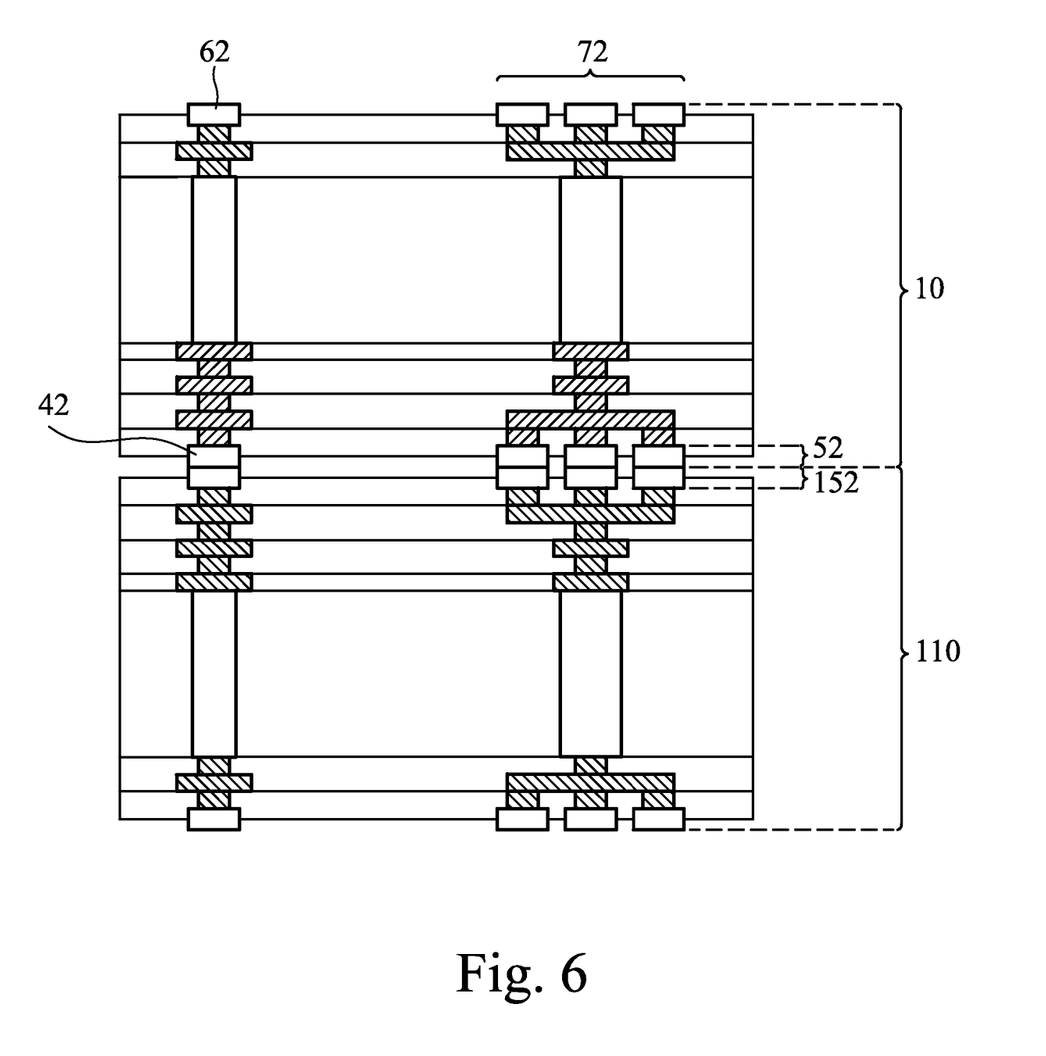
FIG. 6 illustrates the face-to-face bonding of the chips.
Figure 8A:
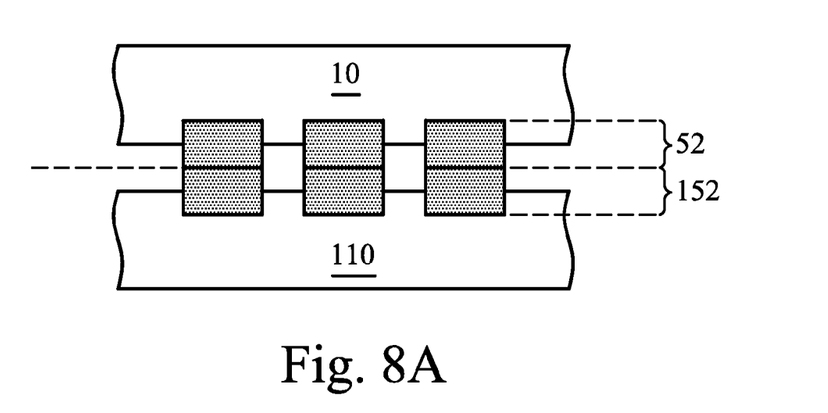
FIGS. 8A through 8C are possible cross-sectional views obtained from different planes of a same pair of bonded chips.
Figure 8B:
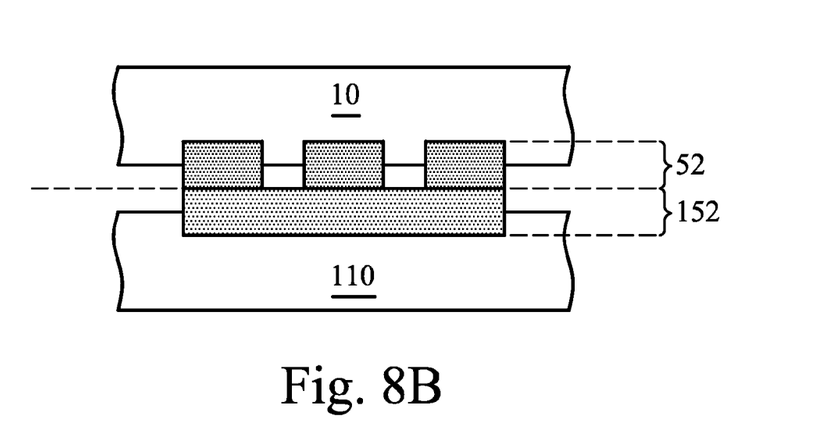
Figure 8C:
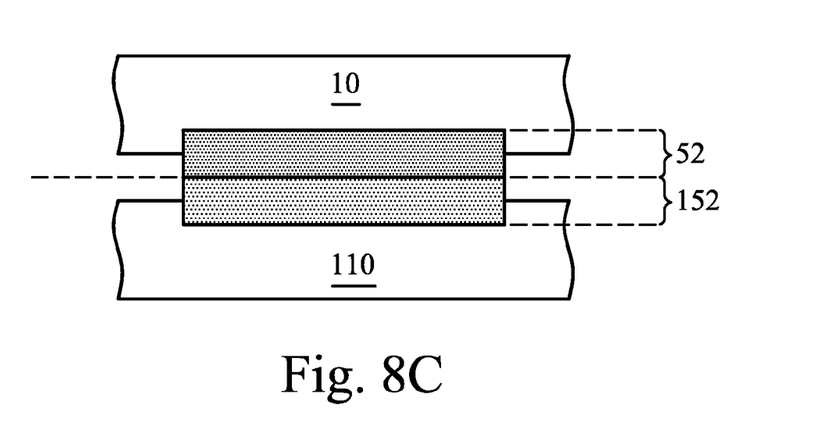

FIG. 6 illustrates a face-to-face bonding of semiconductor chips. Semiconductor chip 110 may have a same or a different structure as that shown in FIGS. 2 through 5. Advantageously, by adopting the embodiments of the present invention, large bond pads 52 and 152 may be formed without the concern that the dishing effect may occur (in the chemical mechanical polish used for forming bond pads 52 and 152). As a result, the surfaces of bond pads 52 and 152 are flatter. When direct bonding is made, a greater percentage of bond pad 52 may be in direct contact with bond pad 152, and hence the resulting bonding is more reliable, and can conduct greater currents. FIGS. 8A, 8B, and 8C illustrate three possible cross-sectional views of the bonding between bond pads 52 and 152, wherein the different views are the results of taking cross-sectional views at different positions (refer to FIGS. 4A and 4B), and/or the results of forming bond pads 52 and 152 with the same or different structures.

Figure 7:
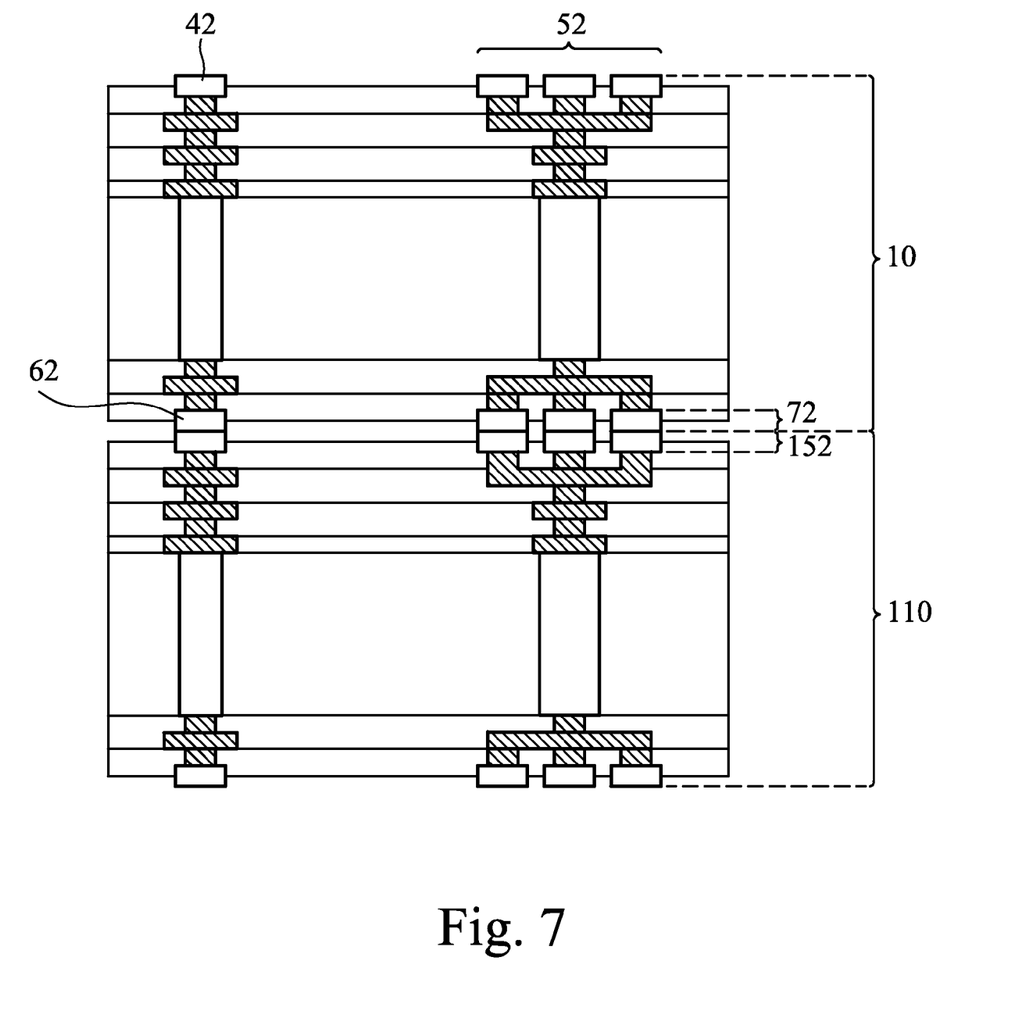
FIG. 7 illustrates the face-to-back bonding of the chips.

The embodiments discussed in the preceding paragraphs may also be used in the face-to-back bonding, as illustrated in FIG. 7. Also, back-to-back bonding (not shown) may also be performed. One skilled in the art will realize the respective structure.

The embodiments of the present invention have several advantageous features. By forming openings/slots in bond pads, the local pattern densities of the bond pads are reduced, and hence the CMP dishing effect is at least reduced, possibly substantially eliminated. The embodiments of the present invention require no additional process steps, and hence the benefits of the present invention are obtained with no added manufacturing cost.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
a semiconductor chip comprising:
a first dielectric layer over a first surface of a substrate;
a second dielectric layer over a second surface of the substrate;
a first patterned bond pad in the first dielectric layer, the first patterned bond pad protruding from the first dielectric layer, wherein the first patterned bond pad comprises a plurality of first portions, and a plurality of first openings between the plurality of first portions, with the first dielectric layer extending into the plurality of first openings;
a second non-patterned bond pad in the second dielectric layer, the second non-patterned bond pad protruding from the second dielectric layer, wherein the second non-patterned bond pad is solid, having no openings formed therein;
first connection structures connecting the plurality of first portions of the first patterned bond pad;
a first through-silicon via (TSV) and a second TSV in the substrate, wherein the first and the second TSVs are electrically connected to the first patterned bond pad and the second non-patterned bond pad; and
a solid bond pad exposed through the first dielectric layer, wherein the solid bond pad is smaller than the first patterned bond pad.

2. The integrated circuit structure of claim 1, wherein the first surface is a front surface of the semiconductor chip.

3. The integrated circuit structure of claim 1, wherein the plurality of first portions are discrete, and wherein the connection structures are in a metallization layer higher than the substrate and lower than the first patterned bond pad.

4. The integrated circuit structure of claim 1, wherein the connection structures are in a layer selected from a layer of the first patterned bond pad.

5. The integrated circuit structure of claim 1, wherein the connection structures are in a layer selected from a metallization layer between the first patterned bond pad and the substrate.

6. The integrated circuit structure of claim 1, further comprising an additional semiconductor chip comprising a bond pad bonded to the first patterned bond pad, wherein portions of the first dielectric layer extending into the plurality of first openings are spaced apart from the additional semiconductor chip.

7. The integrated circuit structure of claim 1, further comprising a third TSV in the substrate electrically connected to the solid bond pad, the third TSV being an only TSV in the substrate electrically connected to the solid bond pad.

8. An integrated circuit structure comprising:
   a first chip comprising:
      a first dielectric layer over a first surface of a substrate, the first dielectric layer comprising a first dielectric layer surface;
      a first patterned bond pad comprising a first lower portion in the first dielectric layer, and a first upper portion protruding beyond the first dielectric layer surface, wherein the first patterned bond pad comprises a plurality of first portions electrically connected to each other, and wherein the first patterned bond pad comprises at least one first opening therein;
      a portion of the first dielectric layer extending into a portion of the at least one opening;
      a second dielectric layer over a second surface of the substrate, the second dielectric layer comprising a second dielectric layer surface;
      a second non-patterned bond pad comprising a second lower portion in the second dielectric layer, and a second upper portion protruding beyond the second dielectric layer surface, wherein the second non-patterned bond pad has no openings formed therein;
      a first and a second through-silicon via (TSV) in the substrate of the first chip, wherein the first and the second TSVs are electrically connected to the first patterned bond and the second non-patterned bond pad; and
      a solid bond pad in a same level as, and electrically disconnected from, the first patterned bond pad, wherein the solid bond pad is smaller than the first patterned bond pad, wherein the solid bond pad is electrically connected to only a single TSV in the substrate; and
   a second chip comprising a bond pad bonded to the first patterned bond pad.

9. The integrated circuit structure of claim 8, wherein the first patterned bond pad comprises a plurality of interconnections electrically interconnecting the plurality of first portions, and wherein the plurality of interconnections are in a same layer as the plurality of first portions.

10. The integrated circuit structure of claim 8, wherein the plurality of first portions are discrete, and wherein the integrated circuit structure further comprises interconnections electrically interconnecting the plurality of first portions, and wherein the interconnections are in a different layer than the plurality of first portions.

11. The integrated circuit structure of claim 8, wherein throughout the first chip, all bond pads over the first surface of the substrate having sizes equal to or greater than the first patterned bond pad are patterned with openings therein, and wherein substantially all bond pads over the first surface of the substrate having sizes equal to or smaller than the solid bond pad are substantially solid.

12. The integrated circuit structure of claim 8 wherein the second chip further comprises:
   an additional dielectric layer comprising a second surface, wherein the bond pad of the second chip is an additional patterned bond pad comprising a lower portion in the additional dielectric layer, and an upper portion protruding beyond the second surface of the additional dielectric layer.

* * * * *